United States Patent
Wu et al.

(10) Patent No.: US 9,711,595 B2
(45) Date of Patent: Jul. 18, 2017

(54) SEMICONDUCTOR DEVICE INCLUDING A SEMICONDUCTOR SHEET UNIT INTERCONNECTING A SOURCE AND A DRAIN

(71) Applicant: Taiwan Semiconductor Manufacturing Company Limited, Hsinchu (TW)

(72) Inventors: Jiun-Peng Wu, Hsinchu (TW); Tetsu Ohtou, Hsinchu (TW); Ching-Wei Tsai, Hsinchu (TW); Chih-Hao Wang, Hsinchu County (TW); Chi-Wen Liu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/132,330

(22) Filed: Apr. 19, 2016

(65) Prior Publication Data
US 2016/0233302 A1    Aug. 11, 2016

Related U.S. Application Data

(63) Continuation of application No. 14/312,739, filed on Jun. 24, 2014, now Pat. No. 9,337,263.

(51) Int. Cl.
*H01L 29/06*   (2006.01)
*H01L 29/423*  (2006.01)
*H01L 29/78*   (2006.01)
*H01L 21/8234* (2006.01)
*H01L 21/8238* (2006.01)

(52) U.S. Cl.
CPC ...... *H01L 29/0676* (2013.01); *H01L 21/8234* (2013.01); *H01L 21/823814* (2013.01); *H01L 21/823885* (2013.01); *H01L 29/06* (2013.01); *H01L 29/0665* (2013.01); *H01L 29/4238* (2013.01); *H01L 29/7827* (2013.01)

(58) Field of Classification Search
CPC ......... H01L 29/66795; H01L 21/82431; H01L 29/66818; H01L 21/845; H01L 29/785; H01L 2924/13061; Y10S 977/938
USPC .................................................. 257/368, 617
See application file for complete search history.

(56) References Cited

U.S. PATENT DOCUMENTS

| 2007/0228433 | A1  | 10/2007 | Forbes |
| 2011/0012085 | A1  | 1/2011  | Deligianni et al. |
| 2012/0025169 | A1* | 2/2012  | Mars ............... B82Y 10/00 257/24 |

(Continued)

OTHER PUBLICATIONS

Taiwan Patent Office, Office Action issued May 20, 2016, in Application No. 104108584.

*Primary Examiner* — Benjamin Sandvik
*Assistant Examiner* — Changhyun Yi
(74) *Attorney, Agent, or Firm* — McDermott Will & Emery LLP

(57) ABSTRACT

A semiconductor device includes a substrate, a pair of source/drain units, and a semiconductor sheet unit. The substrate includes a well region. The source/drain units are disposed above the well region. The semiconductor sheet unit is disposed substantially vertically, interconnects the source/drain units, and defines a cross-sectional shape unit in a top view. The cross-sectional shape unit includes a plurality of cross-sections that have substantially the same shape and different sizes.

20 Claims, 16 Drawing Sheets

(56) References Cited

U.S. PATENT DOCUMENTS

2013/0270508 A1* 10/2013 Li .................. H01L 45/1206
257/4

* cited by examiner

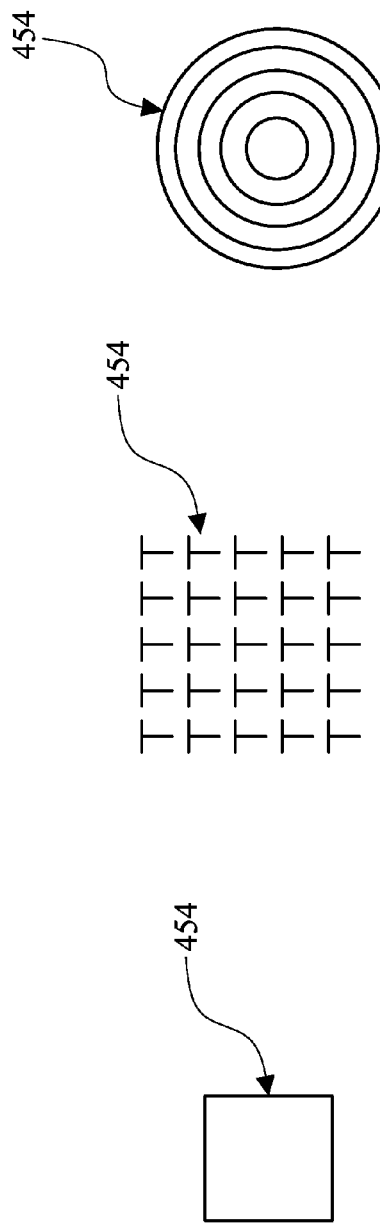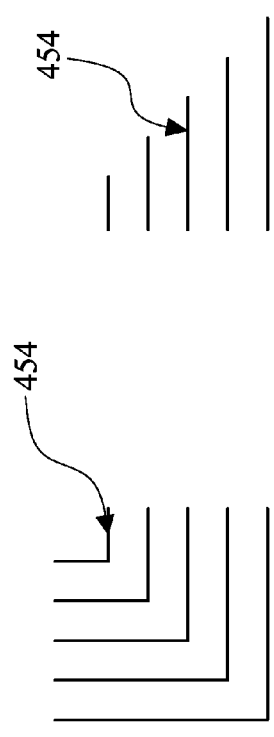
Fig. 13A  Fig. 13B  Fig. 13C  Fig. 13D  Fig. 13E  Fig. 13F

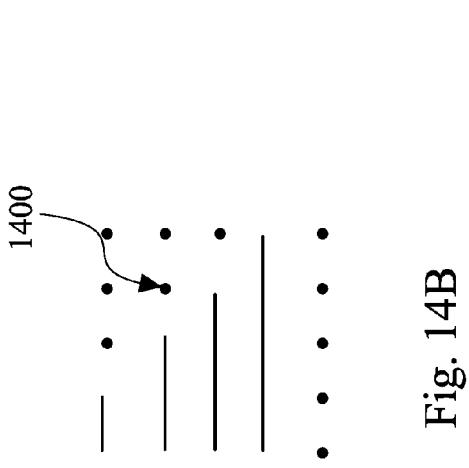
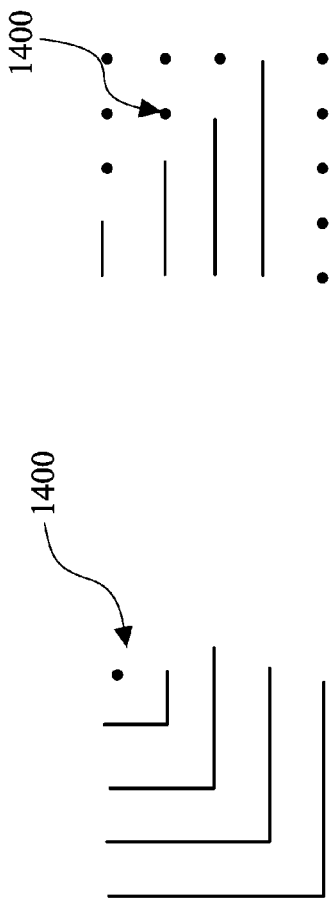
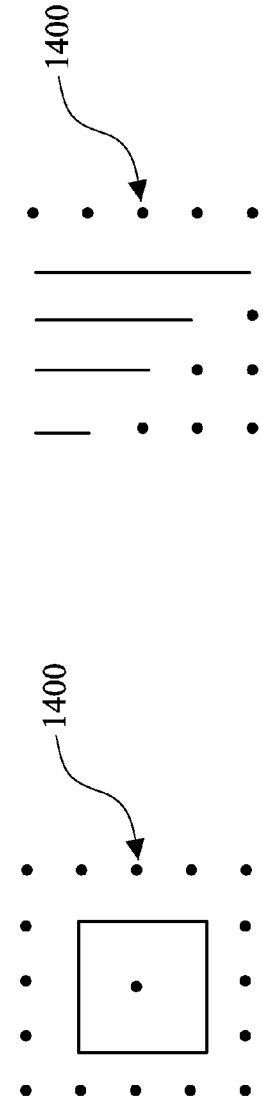
Fig. 14A
Fig. 14B
Fig. 14C
Fig. 14D

SEMICONDUCTOR DEVICE INCLUDING A SEMICONDUCTOR SHEET UNIT INTERCONNECTING A SOURCE AND A DRAIN

CROSS-REFERENCE TO RELATED APPLICATION

This application is a continuation of U.S. patent application Ser. No. 14/312,739, filed Jun. 24, 2014, which is incorporated herein by reference in its entirety.

BACKGROUND

The present disclosure relates to a semiconductor device, more particularly to a semiconductor device that includes a semiconductor sheet unit that interconnects a source and a drain.

A conventional vertical gate all around (VGAA) metal-oxide semiconductor field-effect transistors (MOSFETs) is a semiconductor device that includes a plurality of sources, a plurality of drains, and a plurality of nanowires. Each of the nanowires extends in a vertical direction, interconnects, and thus serves as a channel between, a respective one of the sources and a respective one of the drains, and has a cross-sectional shape of a dot. Modification of such channel can improve the performance of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A-13F are schematic top views illustrating cross-sectional shapes of the semiconductor sheet unit, in accordance with some embodiments.

FIGS. 14A-14D are schematic top views illustrating cross-sectional shapes of the semiconductor sheet unit and the nanowire unit, in accordance with some embodiments.

DETAILED DESCRIPTION

Figure 1:
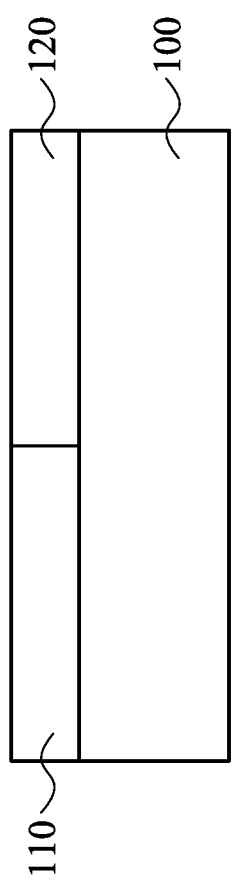
FIGS. 1-12 are schematic sectional views of a semiconductor device at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underneath," "below," "lower," "above," "on," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 16:
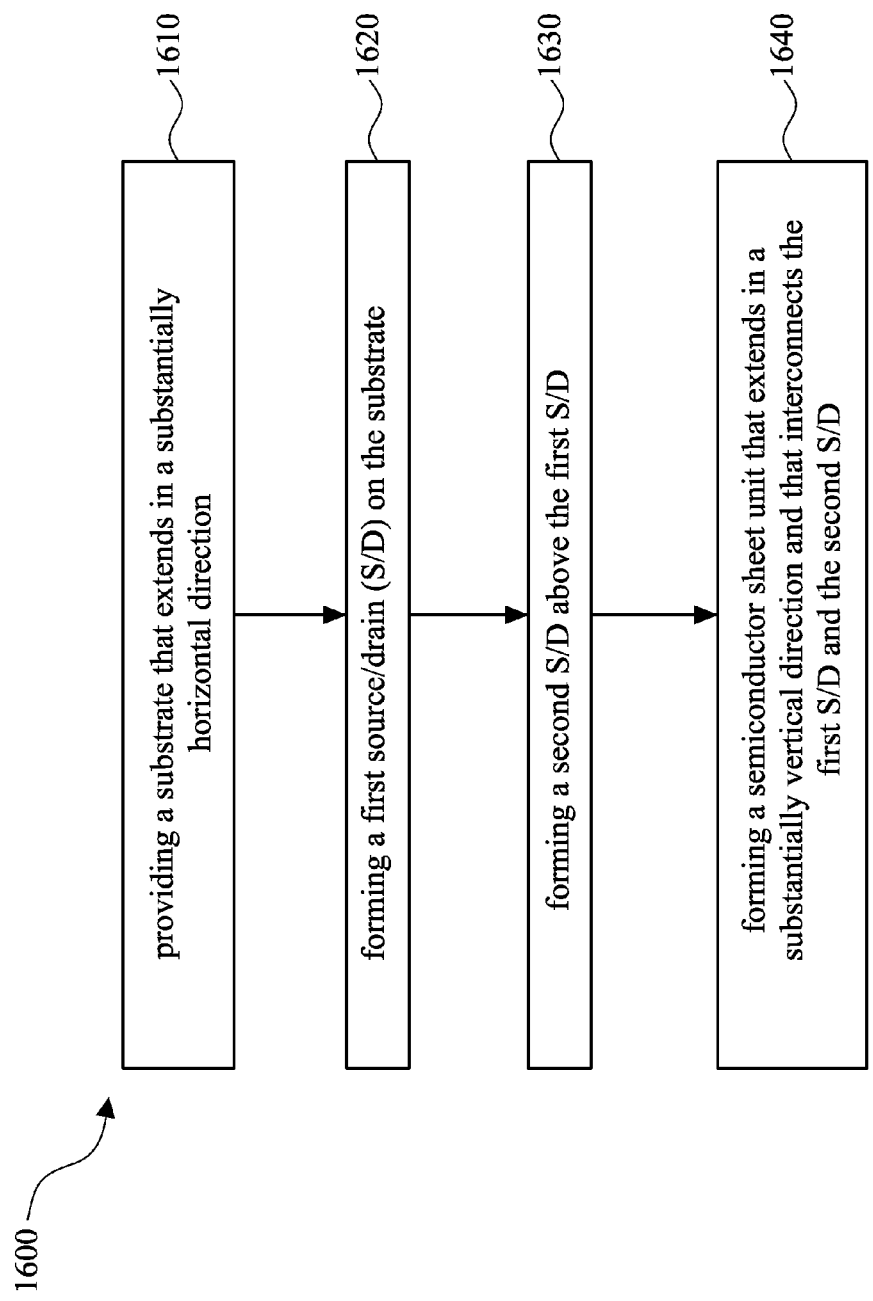
FIG. 16 is a flowchart illustrating a method for fabricating a semiconductor device, in accordance with some embodiments.

Referring to FIG. 16, the exemplary method 1600 for fabricating a semiconductor device according to the present disclosure begins with block 1610 in which a substrate is provided. The substrate extends in a substantially horizontal direction. The method 1600 continues with block 1620 in which a first source/drain (S/D) is formed on the substrate. The method 1600 continues with block 1630 in which a second S/D is formed. The second S/D is disposed above the first S/D. The method 1600 continues with block 1640 in which a semiconductor sheet unit is formed. The semiconductor sheet unit extends in a substantially vertical direction and interconnects the first S/D and the second S/D.

FIGS. 1-4 illustrate the sequence of operations in the fabrication of a semiconductor device according to the method 1600 of FIG. 16.

The first operation is to provide a substrate.

A next operation is to form a well region of a p conductivity type in a first portion of the substrate, and a well region of an n conductivity type in a second portion of the substrate that is spaced apart from the first portion of the substrate in a substantially horizontal direction. For example, FIG. 1 illustrates the structure after the formation of the p-type well region 110 and the n-type well region 120 in the substrate 100. In one exemplary embodiment, the formation of the p-type well region 110 and the n-type well region 120 may include the following sub-operations: depositing a protective layer over the substrate 100; patterning and etching the protective layer to expose the first portion of the substrate 100; forming one of the p-type and n-type well regions 110, 120 in the exposed portion of the substrate 100, such as by an implantation or diffusion process; removing, such as by an etching process, the remaining protective layer; depositing another protective layer over the one of the p-type and n-type well regions 110, 120 and the substrate 100; patterning and etching the protective layer to expose the second portion of the substrate 100; forming the other of the p-type and n-type well regions 110, 120 in the exposed portion of the substrate 100; and removing the remaining of the protective layer, thereby resulting in the structure shown in FIG. 1.

Figure 2:
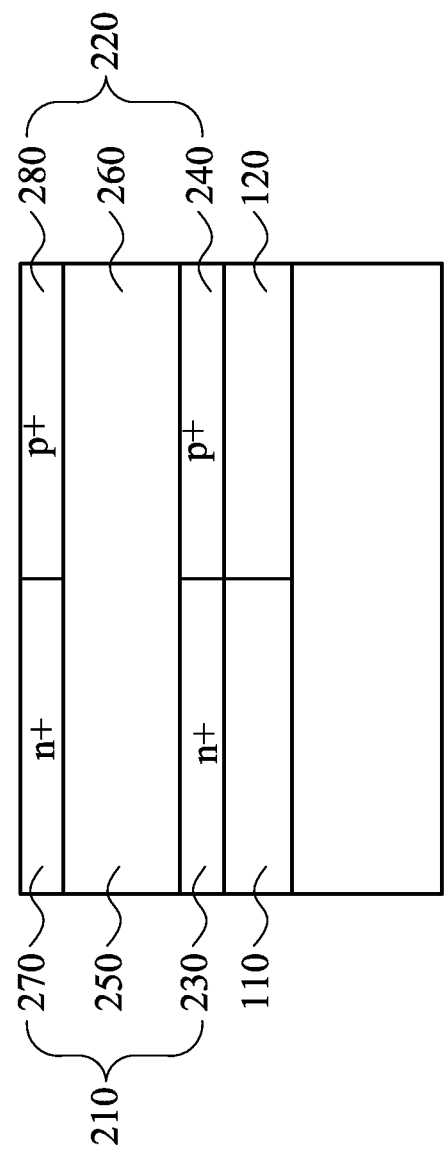

Next, referring to FIG. 2, a first epitaxially grown layer unit 210 is formed on the p-type well region 110. Thereafter, a second epitaxially grown layer unit 220 is formed on the n-type well region 120. As illustrated in FIG. 2, each of the first and second epitaxially grown layer units 210, 220 includes a first epitaxially grown layer 230, 240, a second epitaxially grown layer 250, 260, and a third epitaxially grown layer 270, 280. In one exemplary embodiment, the formation of the first epitaxially grown layer unit 210 may include the following sub-operations: forming the first epitaxially grown layer 230 on the p-type well region 110 using a first epitaxial growth process, forming the second epitaxially grown layer 250 on the first epitaxially grown layer 230 using a second epitaxial growth process, and forming the third epitaxially grown layer 270 on the second epitaxially grown layer 250 using a third epitaxial growth process.

The formation of the second epitaxially grown layer unit 220 may include sub-operations similar to those of the formation of the first epitaxially grown layer unit 210, i.e.,: forming the first epitaxially grown layer 240 on the n-type well region 120 using the first epitaxial growth process; forming the second epitaxially grown layer 260 on the first epitaxially grown layer 240 using the second epitaxial growth process; and forming the third epitaxially grown layer 280 on the second epitaxially grown layer 260 using the third epitaxial growth process.

In some embodiments, the first, second, and third epitaxial growth processes are sequentially performed in-situ. That is, the first, second, and third epitaxial growth processes may be carried out without a vacuum break in constituent process chambers. In other embodiments, the first, second, and third epitaxial growth processes are performed ex-situ. For example, a top surface of the first epitaxially grown layer 230, 240 may be cleaned prior to the formation of the second epitaxially grown layer 250, 260 thereon, and a top surface of the second epitaxially grown layer 250, 260 may be cleaned prior to the formation of the third epitaxially grown layer 270, 280 thereon.

The first epitaxially grown layer unit 210 is doped with an n-type dopant. The first and third epitaxially grown layers 230, 270 are doped with a higher concentration of the n-type dopant than the second epitaxially grown layer 250. This is shown in FIG. 2, where the first and third epitaxially grown layers 230, 270 are indicated as having an n+ conductivity type. Similarly, the second epitaxially grown layer unit 220 is doped with a p-type dopant. The first and third epitaxially grown layers 240, 280 are doped with a higher concentration of the p-type dopant than the second epitaxially grown layer 260. This is shown in FIG. 2, where the first and third epitaxially grown layers 240, 280 are indicated as having a p+ conductivity type.

It should be understood that the order of the formations of the first and second epitaxially grown layer units 210, 220 can be reversed. That is, the formation of the second epitaxially grown layer unit 220 on the n-type well region 120 may be performed first, and the formation of the first epitaxially grown layer unit 210 on the p-type well region 110 may be performed second.

Figure 3:
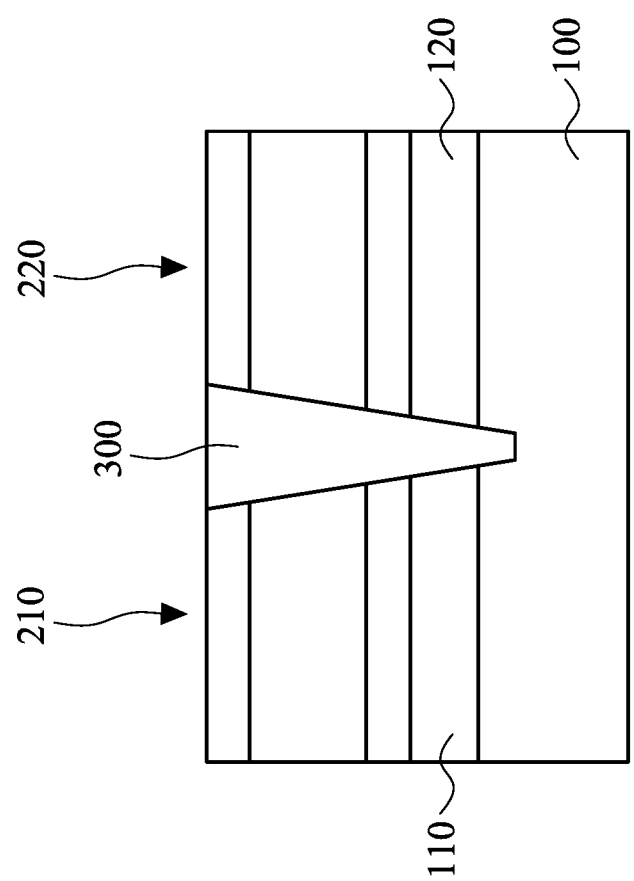

After the formations of the first and second epitaxially grown layer units 210, 220, an isolation layer is formed in the structure of FIG. 2 so as to separate the first and second epitaxially grown layer units 210, 220 and so as to separate the p-type and n-type well regions 110, 120. For example, FIG. 3 illustrates the structure of FIG. 2 after the formation of the isolation layer 300. In one exemplary embodiment, the isolation layer 300 may be formed using a shallow trench isolation (STI) process in which: a trench is formed that extends through a junction of the first and second epitaxially grown layer units 210, 220, through a junction of the p-type and n-type well regions 110, 120, and into the substrate 100; and a dielectric material, such as, SiO2 or SiN, is deposited to fill the trench. A thermal oxide trench liner may be optionally grown in the trench, with silicon nitride or silicon oxide formed over the liner. Next, the excess dielectric material are removed, such as by an etching process, thereby resulting in the structure shown in FIG. 3.

Next, a hard mask layer is formed over the structure of FIG. 3, after which the hard mask layer is patterned and etched to form a patterned hard mask layer and to expose portions of the first and second epitaxially grown layer units 210, 220. The patterned hard mask layer may, for example, includes a first set of hard masks that are disposed on the first epitaxially grown layer unit 210, that are spaced apart from each other in the horizontal direction, and that extend in parallel to each other, and a second set of hard masks that are disposed on the second epitaxially grown layer unit 220, that are spaced apart from each other in the horizontal direction, and that extend in parallel to each other.

Figure 4:
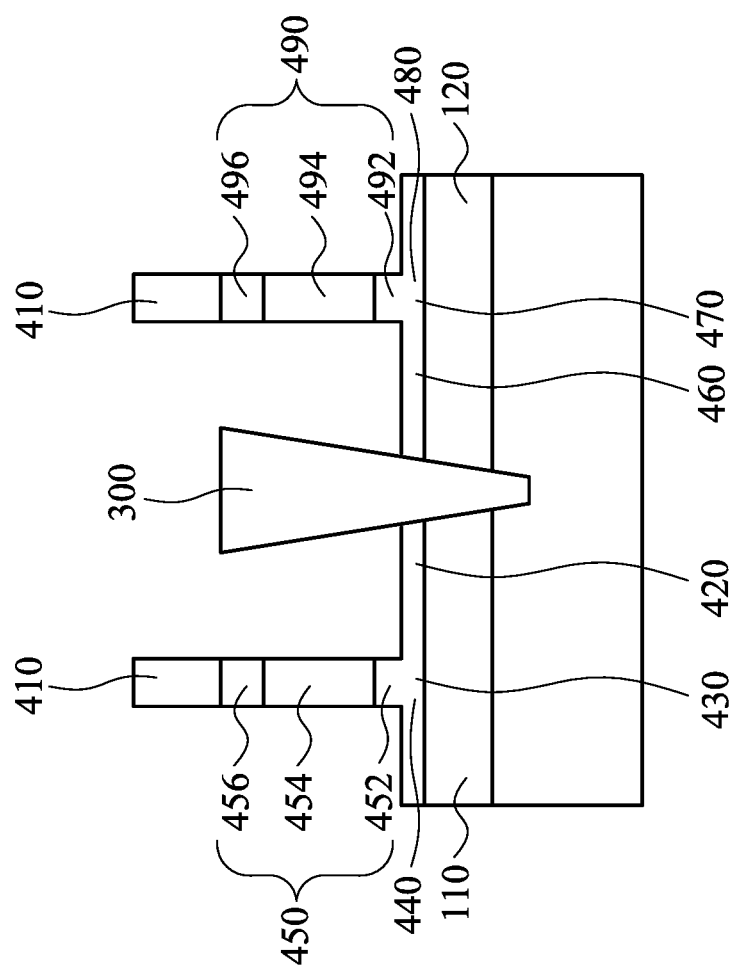

Subsequently, referring to FIG. 4, using the hard masks 410 (only one of the hard masks 410 in each of the first and second sets is shown in FIG. 4), the exposed portions of the first and second epitaxially grown layer units 210, 220 are removed to form an unetched layer 420, a plurality of etched layers 450 (only one of the etched layers 450 is shown in FIG. 4), an unetched layer 460, and a plurality of etched layers 490 (only one of the etched layers 490 is shown in FIG. 4).

The uneteched layer 420 is disposed on the p-type well region 110, and includes a plurality of surrounded portions 430 (only one of the surrounded portions 430 is shown in FIG. 4), each of which serves as a first end portion of a respective one of sources 440, and a surrounding portion that surrounds the surrounded portions 430. Each of the etched layers 450 includes a second end portion 452 of the respective one of the sources 440 that extends from the first end portion 430 of the respective one of the sources 440, drain 456 that is disposed above the respective one of the sources 440, and a semiconductor sheet 454 that extends in a substantially vertical direction, and that interconnects the second end portion 452 of the respective one of the sources 440 and a respective one of the drains 456.

The uneteched layer 460 is disposed on the n-type well region 120, and includes a plurality of surrounded portions 470 (only one of the surrounded portions 470 is shown in FIG. 4), each of which serves as a first end portion of a respective one of sources 480, and a surrounding portion that surrounds the surrounded portions 470. Each of the etched layers 490 includes a second end portion 492 of the respective one of the sources 480 that extends from the first end portion 470 of the respective one of the sources 480, a drain 496 that is disposed above the respective one of the sources 480, and a semiconductor sheet 494 that extends in a substantially vertical direction, and that interconnects the second end portion 492 of the respective one of the sources 480 and a respective one of the drains 496.

For clarity of illustration, the thicknesses of the hard mask 410, the second end portion 452, 492 of the source 440, 480, the drain 456, 496, and the semiconductor sheet 454, 494 in FIG. 4 are exaggerated.

In some embodiments, the second end portion 452, 492 of the source 440, 480 extends along a bottom end of the semiconductor sheet 454, 494, and the drain 456, 496 extends along a top end of the semiconductor sheet 454, 494. In other embodiments, the source 440, 480 is formed on the top end of the semiconductor sheet 454, 494. In such other embodiments, the drain 456, 496 is formed on the bottom end of the semiconductor sheet 454, 494.

The semiconductor sheet 454, 494 has a minimum thickness sufficient to allow for fabrication thereof. That is, the semiconductor sheet 454, 494 can be as thin as semiconductor fabrication processes allow, and can be made thinner as fabrication techniques advance. In this embodiment, the second end portion 452, 492 of the source 440, 480 and the drain 456, 496 have a substantially same thickness as the semiconductor sheet 454, 494.

In this example embodiment, the semiconductor sheets 454 have a generally rectangular shape, are spaced apart from each other in the horizontal direction, and extend generally in parallel to each other. As a result of such a configuration, the semiconductor sheets 454 cooperatively define cross-sectional shapes of substantially parallel straight lines along a substantially horizontal plane.

Although a semiconductor sheet 454 with a generally straight line cross section is used in this example, in other examples, a semiconductor sheet that has a cross-sectional shape other than a straight line may be used. Such cross-sectional shapes include, for example, a U-shaped cross section, an L-shaped cross section, an annular, a sinusoidal, and the like.

In one embodiment, the semiconductor sheets 454 may cooperatively define a single cross-sectional shape of, for example, a square, as best shown in FIG. 13A. In another embodiment, the semiconductor sheets 454 may cooperatively define a plurality of cross sections that have the same shape and size, such as those shown in FIG. 13B. In yet another embodiment, the semiconductor sheets 454 may cooperatively define a plurality of cross sections that have the same shape but different sizes, such as those shown in FIGS. 13C-13E. In still yet another embodiment, the semiconductor sheets 454 may cooperatively define a plurality of different cross-sectional shapes, such as those shown in FIG. 13F.

Referring back to FIG. 4, in this example embodiment, the semiconductor sheets 494 cooperatively define one or more cross sections identical to those of the semiconductor sheets 454. In an alternative embodiment, the semiconductor sheets 494 may cooperatively define one or more cross-sectional shapes different from, or substantially the same as, but have different sizes from, those of the semiconductor sheets 454.

In some embodiments, the example method further includes the operations of: forming at least one source, at least one drain, and at least one nanowire that extends in the vertical direction, that interconnects the at least one source and the at least one drain, and that has a cross-sectional shape of a dot. In such some embodiment, the semiconductor sheets and the at least one nanowire 1400 may cooperatively define cross-sectional shapes, such as those shown in FIGS. 14A-14D.

Figure 15:
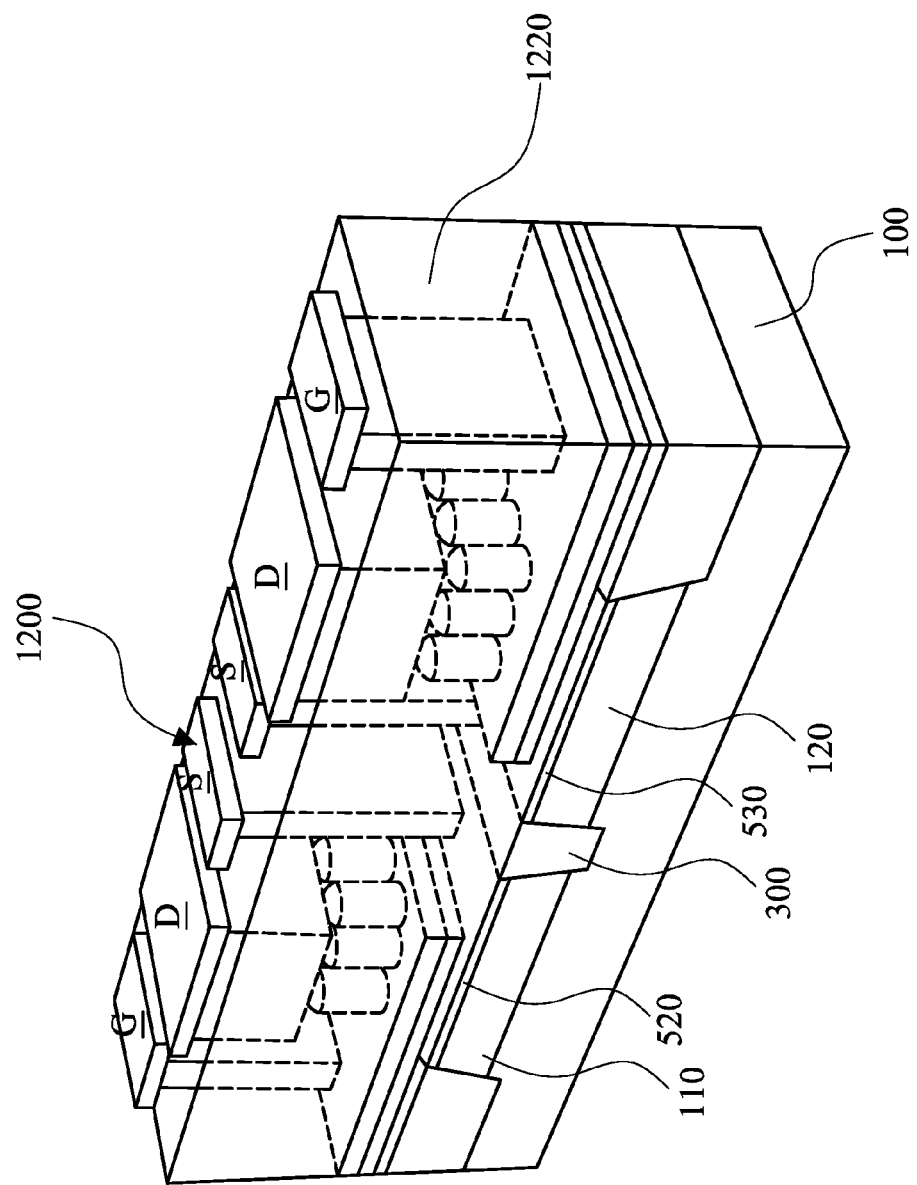
FIG. 15 is a schematic perspective view of the exemplary embodiment of a semiconductor device, in accordance with some embodiments.

Referring to FIGS. 4 and 15, the exemplary embodiment of the semiconductor device according to the present disclosure includes the substrate 100, the p-type well region 110, the n-type well region 120, the sources 440, 480, the drains 456, 496, and the semiconductor sheets 454, 494.

The p-type well region 110 is formed in a first portion of the substrate 100. The n-type well region 120 is formed in a second portion of the substrate 100 that is spaced apart from the first portion of the substrate 100 in a substantially horizontal direction.

Each of sources 440, 480 has a generally inverted-T cross-sectional shape along a substantially vertical plane, and includes a first end portion 430 formed on the p-type well region 110, and a second end portion 452. Similarly, each of the sources 480 has a generally inverted-T cross-sectional shape along the vertical plane, and includes a first end portion 470 formed on the n-type well region 120, and a second end portion 492.

Each of the drains 456, 496 is disposed above a respective one of the sources 440, 480.

Each of the semiconductor sheets 454, 494 extends in a substantially vertical direction, and interconnects the second end portion 452, 492 of a respective one of the sources 440, 480 and a respective one of the drains 456, 496.

In this example embodiment, the second end portion 452, 492 of the source 440, 480 extends along a bottom end of the semiconductor sheets 454, 494, and the drain 456, 496 extends along a top end of the semiconductor sheet 454, 494. In an alternative embodiment, the source 440, 480 is formed on the top end of the semiconductor sheet 454, 494. In such an alternative embodiment, the drain 456, 496 is formed on the bottom end of the semiconductor sheets 454, 494.

The semiconductor sheet 454, 494 has a minimum thickness sufficient to allow for fabrication thereof. That is, the semiconductor sheet 454, 494 can be as thin as semiconductor fabrication processes allow, and can be made thinner as fabrication techniques advance. In this embodiment, the second end portion 452, 492 of the source 440, 480 and the drain 456, 496 have a substantially same thickness as the semiconductor sheet 454, 494.

In this example embodiment, the semiconductor sheets 454 have a generally rectangular shape, are spaced apart from each other in the horizontal direction, and extend generally in parallel to each other. As a result of such a configuration, the semiconductor sheets 454 cooperatively define cross-sectional shapes of substantially parallel straight lines along a substantially horizontal plane.

Although a semiconductor sheet 454 with a generally straight line cross section is used in this example, in other examples, a semiconductor sheet that has a cross-sectional shape other than a straight line may be used. Such cross-sectional shapes include, for example, a U-shaped cross section, an L-shaped cross section, an annular, a sinusoidal cross section, and the like.

In one embodiment, the semiconductor sheets 454 may cooperatively define a single cross-sectional shape of, for example, a square, as best shown in FIG. 13A. In another embodiment, the semiconductor sheets 454 may cooperatively define a plurality of cross sections that have the same shape and size, such as those shown in FIG. 13B. In yet another embodiment, the semiconductor sheets 454 may cooperatively define a plurality of cross sections that have the same shape but different sizes, such as those shown in FIGS. 13C-13E. In still yet another embodiment, the semiconductor sheets 454 may cooperatively define a plurality of different cross-sectional shapes, such as those shown in FIG. 13F.

Referring back to FIGS. 4 and 15, in this example embodiment, the semiconductor sheets 494 cooperatively define one or more cross sections identical to those of the semiconductor sheets 454. In an alternative embodiment, the semiconductor sheets 494 may cooperatively define one or more cross-sectional shapes different from, or substantially same as, but have different sizes from, those of the semiconductor sheets 454.

In some embodiments, the example semiconductor device further includes at least one source, at least one drain, and at least one nanowire that extends in the vertical direction, that interconnects the at least one source and the at least one drain, and that a cross-sectional shape of a dot. In such other embodiments, the semiconductor sheets and the at least one nanowire 1400 may cooperatively define cross-sectional shapes, such as those shown in FIGS. 14A-14D.

FIGS. 5-12 illustrate the next sequence of operations in the fabrication of the semiconductor device according to the method 1600 of FIG. 16.

Figure 5:
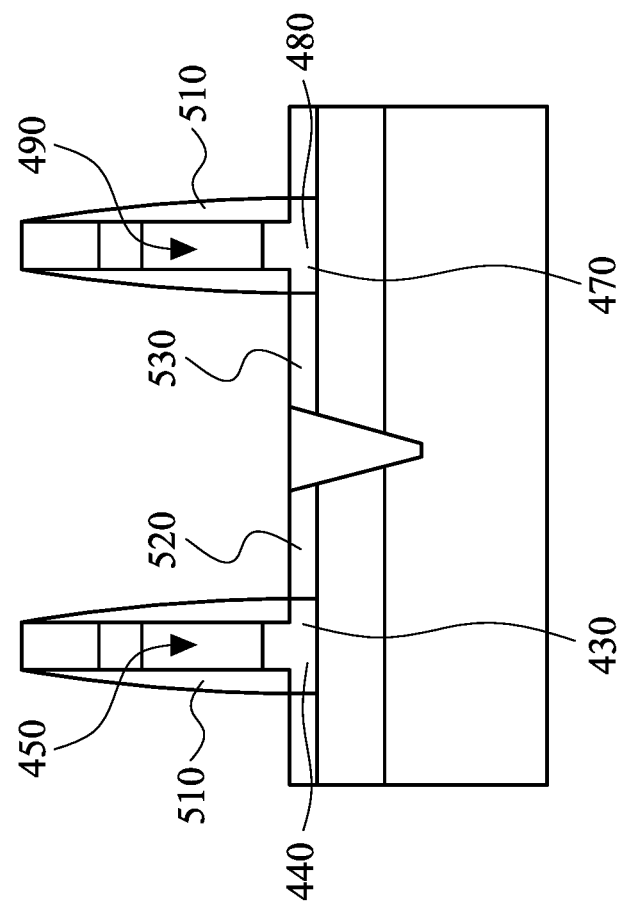

FIG. 5 illustrates the structure of FIG. 4 after a pair of source silicides 520, 530 are formed. Each of source silicides 520, 530 surrounds a respective one of the first end portions 430 of the sources 440 and the first end portions 470 of the sources 480. In one exemplary embodiment, the formations of the source silicides 520, 530 may include the following sub-operations: removing, such as by an etching process, a portion of the isolation layer 300 that protrudes outwardly from the unetched layers 420, 460 (see FIG. 4) to thereby make the isolation layer 300 substantially level with the unetched layers 420, 460; forming a spacer 510 around each of the etched layers 450, 490; forming silicide metal, such as Ti, Ni, Co, and the like, over the structure following the formation of the spacers 510; subjecting the structure following the formation of the silicide metal to an annealing process to thereby react the silicide metal, whereby the reacted silicide metal forms the source silicides 520, 530; and removing the unreacted metals, thereby resulting in the structure shown in FIG. 5. Examples of materials for forming the spacers 510 include, but are not limited to, SiN, SiO2, and SiON.

Figure 6:
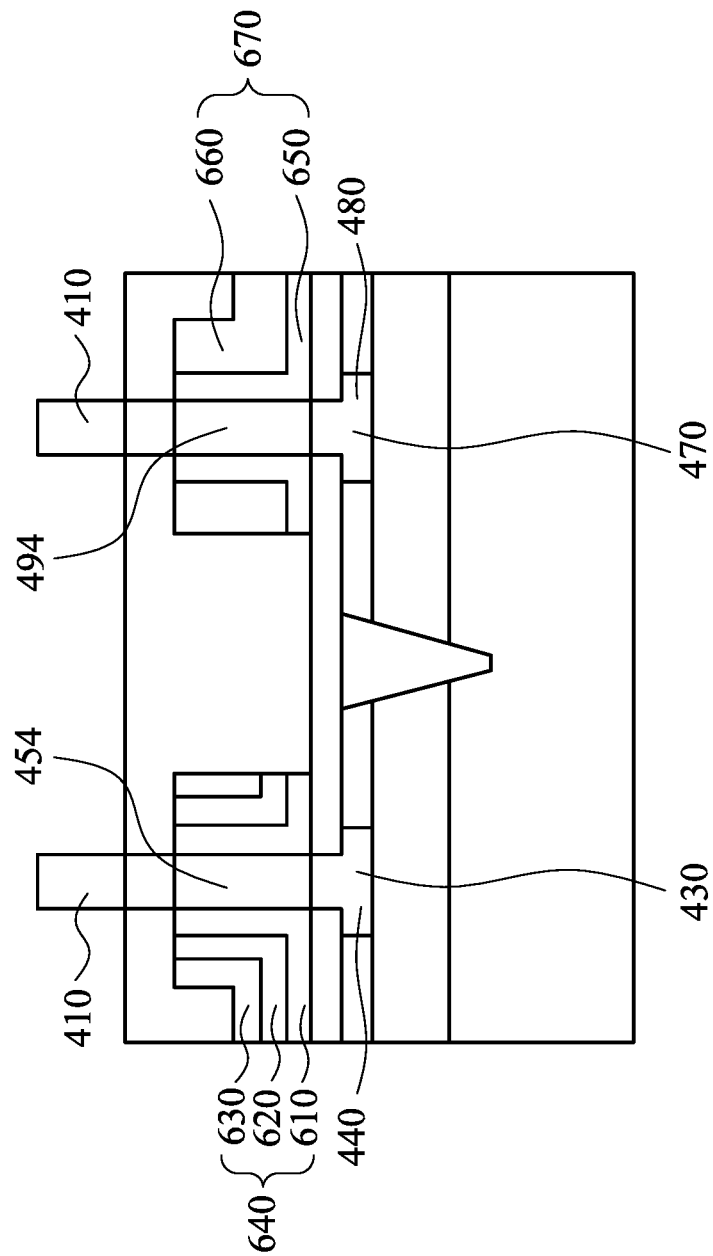

Next, a pair of gate stacks are formed, each of which surrounds a respective one of the semiconductor sheets 454 and the semiconductor sheets 494. For example, FIG. 6 illustrates the structure of FIG. 5 after the formation of the gate stacks 640, 670. The gate stack 640 includes a gate oxide 610 that surrounds and that is in direct contact with the semiconductor sheets 454, a first gate 620 that surrounds and that is in direct contact with the gate oxide 610, and a second gate 630 that surrounds and that is in direct contact with the first gate 620. The gate stack 670 includes a gate oxide 650 that surrounds and that is in direct contact with the semiconductor sheets 494, and a gate 660 that surrounds and that is in direct contact with the gate oxide 650.

Figure 7:
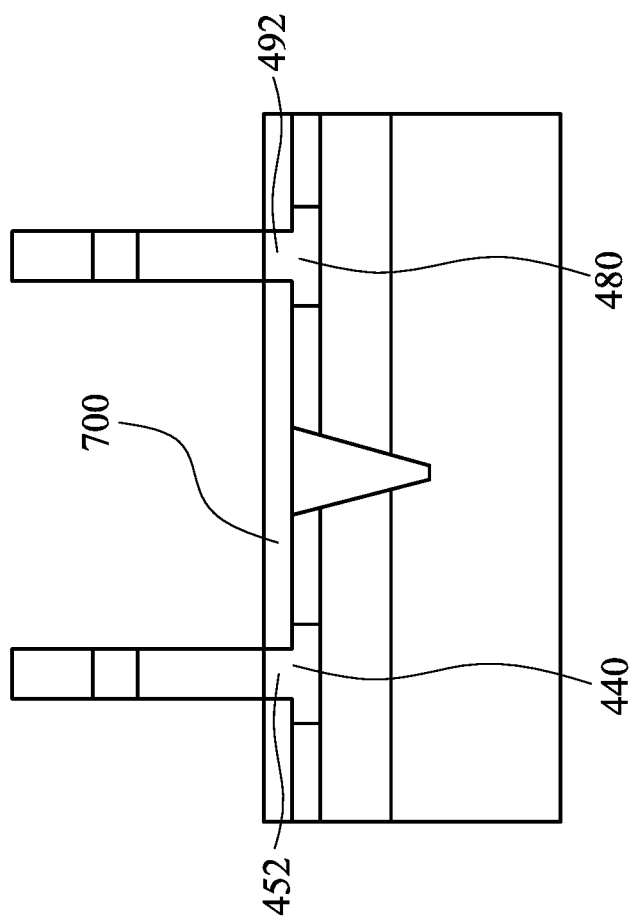
Figure 8:
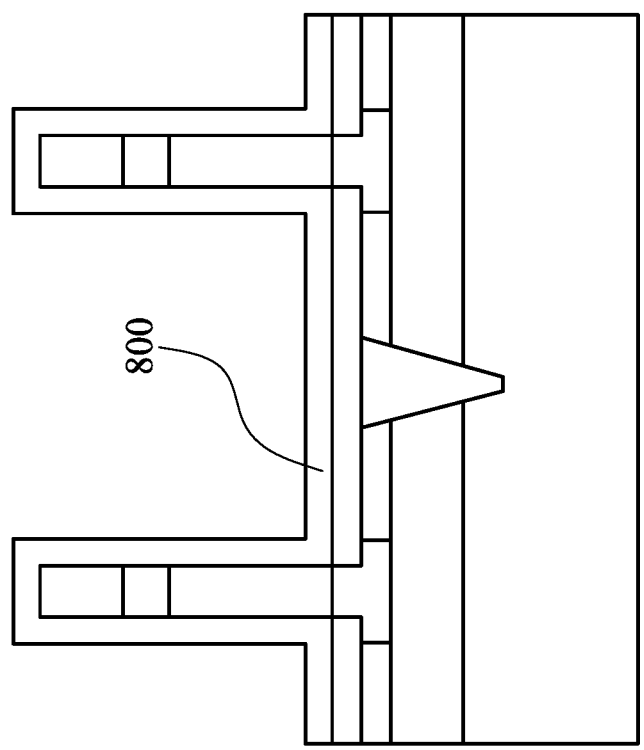
Figure 9:
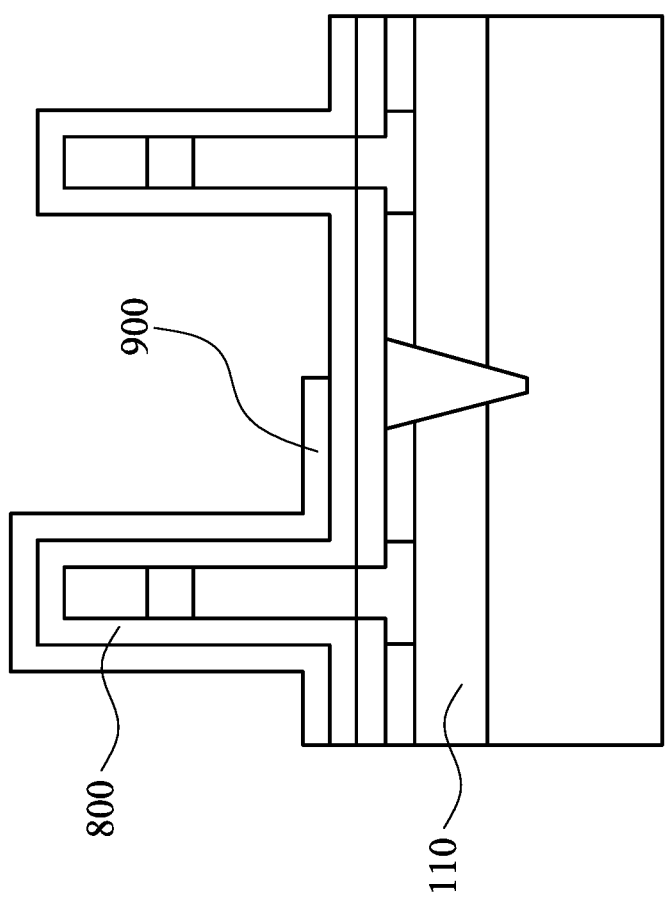
Figure 10:
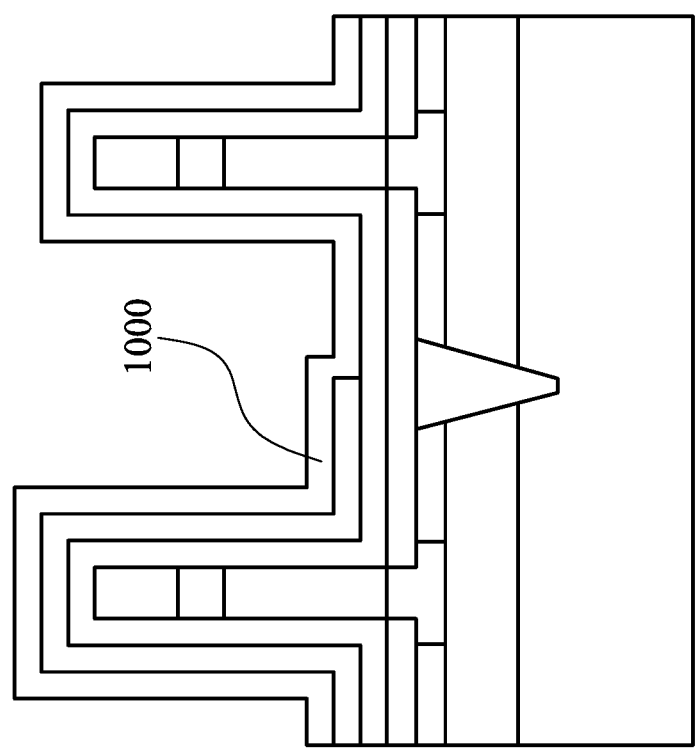

In one exemplary embodiment, the formation of the gate stacks 640, 670 may include the following sub-operations: removing, such as by an etching process, the spacers 510 from the structure of FIG. 5; forming a first inter-layer dielectric (ILD) layer, such as SiO2, SiCN, SiN, or SiOCN, over the structure following the removal of the spacers 510; etching the first ILD layer to make the etched first ILD layer 700 substantially level with the second end portion 452, 492 of the sources 440, 480, thereby resulting in the structure shown in FIG. 7; forming a dielectric layer 800 over the structure of FIG. 7, thereby resulting in the structure shown in FIG. 8; forming a first conductive layer over the structure of FIG. 8, after which a portion of the first conductive layer is removed such that the remaining first conductive layer 900 is present only on the dielectric layer 800 above the p-type well region 110, thereby resulting in the structure shown in FIG. 9; forming a second conductive layer 1000 over the structure of FIG. 9 in a conformal manner, thereby resulting in the structure shown in FIG. 10; and cutting the dielectric layer 800 and the first and second conductive layers 900, 1000 to form the gate stacks 640, 670 shown in FIG. 6.

The dielectric layer 800 may include a high-K dielectric, such as HfO$_2$, Al$_2$O$_3$, or La$_2$O$_3$, or an oxide. Examples of materials for forming the first and second conductive layers 900, 1000 include, but are not limited to, Ti, TA, Al, W, TiN, Tan, and TiAl.

Figure 11:
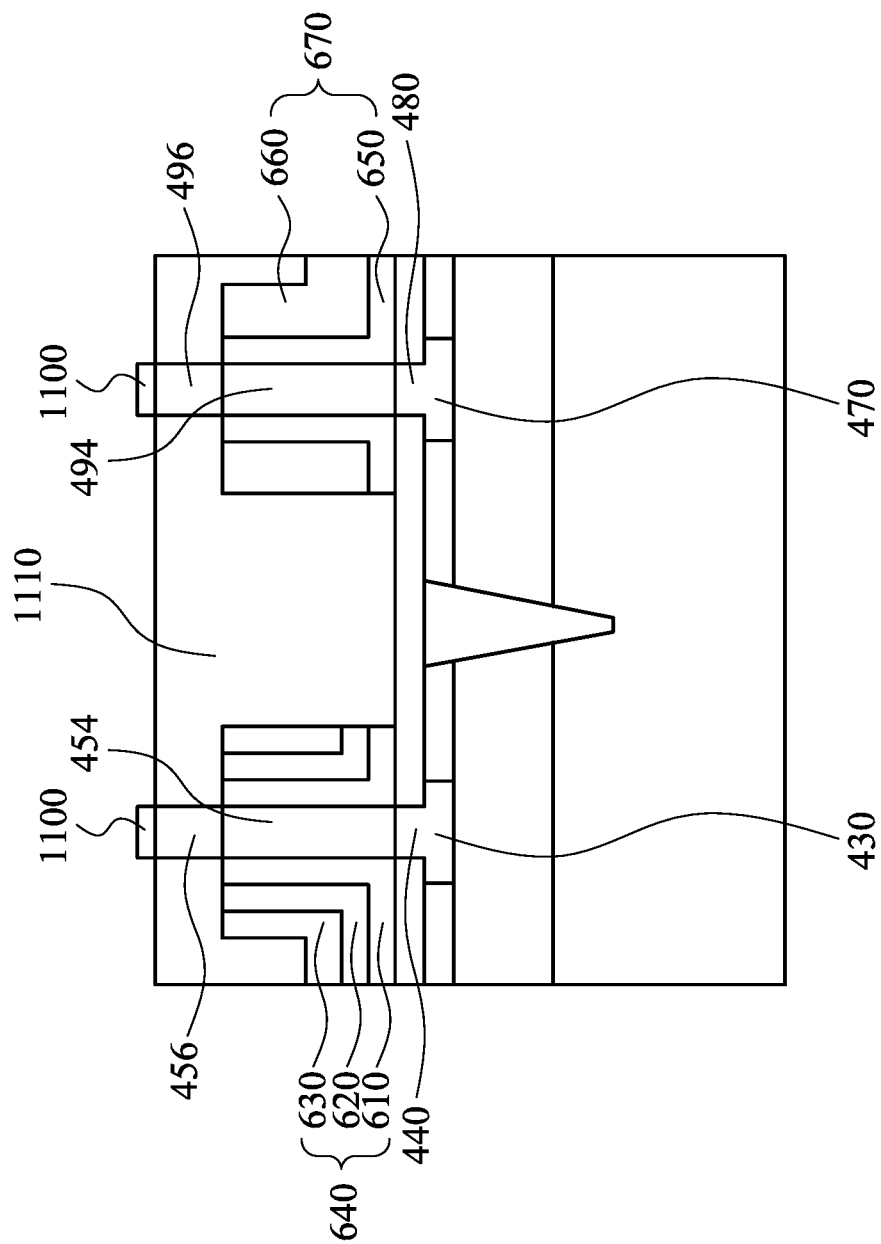

Next, a plurality of drain silicides are formed, each of which is provided on a respective one of the drains 456, 496. For example, FIG. 11 illustrates the structure of FIG. 6 after the formation of the drain silicides 1100. In one exemplary embodiment, the formation of the drain silicides 1100 includes the following sub-operations: forming a second ILD layer over the structure of FIG. 6; planarizing, such as by chemical-mechanical polishing/planarization (CMP), the second ILD layer until the planarized second ILD layer 1110 substantially levels with the drains 456, 496, thereby removing the hard masks 410; forming a silicide metal, such as Ti, Ni, or Co, over the drains 456, 496 and the second ILD layer 1110; subjecting the structure following the formation of the silicide metal to an annealing process to thereby react the silicide metal, whereby the reacted silicide metals forms the drain silicides 1100; and removing the unreacted silicide metals, thereby resulting in the structure shown in FIG. 11.

Figure 12:
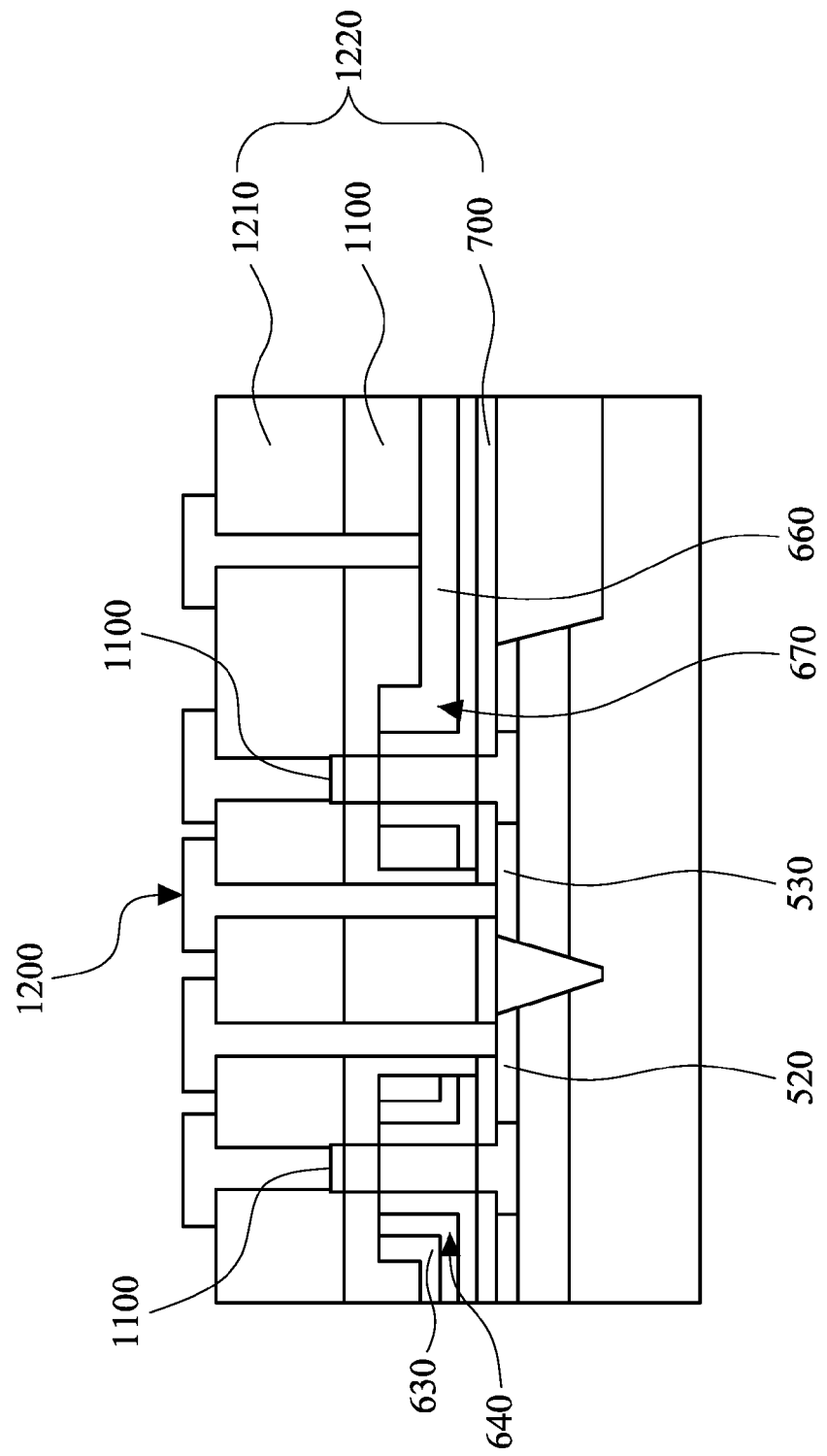

Finally, a plurality of contacts are formed, each of which is connected electrically to a respective one of the source silicides 520, 530, the drain silicides 1100, the second gate 630 of the gate stack 640, and the gate 660 of the gate stack 670. For example, FIG. 12 illustrates the structure of FIG. 11 after the formation of the contacts 1200 (the contact 1200 for the second gate 630 of the gate stack 640 is not shown in FIG. 12). In one exemplary embodiment, the contacts 1200 are formed, using a middle-end-of-lines (MEOL) process, in which a third ILD layer 1210 is formed over the structure of FIG. 11. The first ILD layer 700, the second ILD layer 1110, and the third ILD layer 1210 constitute an insulation 1220. Next, the insulation 1220 is patterned and etched to form contact openings, each of which extends through the insulation 1220 and connects onto a respective one of the source silicides 520, 530, the drain silicides 1100, the second gate 630 of the gate stack 640, and the gate 660 of the gate stack 670. Thereafter, a conductive layer is formed over the insulation 1220 and in the contact openings, after which the conductive layer is patterned and etched, whereby the contacts 1200 shown in FIG. 12 are formed.

Referring to FIGS. 11 and 15, the example semiconductor device further includes the source silicides 520, 530, the gate stacks 640, 670, the drain silicides 1110, the isolation layer 300, the insulation 1220, and the contacts 1200.

Each of the source silicides 520, 530 is formed on a respective one of the p-type and n-type well regions 110, 120, and surrounds a respective one of the first end portions 430 of the sources 440 and the first end portions 470 of the sources 480.

The isolation layer 300, such as an STI layer or any suitable isolation layer, extends through a junction of the source silicides 520, 530, through a junction of the p-type and n-type well regions 110, 120, and into the substrate 100.

The gate stack 640 includes a gate oxide 610 that surrounds and that is in direct contact with the semiconductor sheets 454, a first gate 620 that surrounds and that is in direct contact with the gate oxide 610, and a second gate 630 that surrounds and that is in direct contact with the first gate 620.

The gate stack 670 includes a gate oxide 650 that surrounds and that is in direct contact with the semiconductor sheets 494, and a gate 660 that surrounds and that is in direct contact with the gate oxide 650.

Since the sources 440, the drains 456, the semiconductor sheets 454 are doped with n-type dopant, since the semiconductor sheets 454 extend in the vertical direction, and since the gate stack 640 surrounds the semiconductor sheets 454, the configuration of the sources 440, the drains 456, the semiconductor sheets 454, and the gate stack 640 may be referred to as a vertical gate-all-around (VGAA) n-channel metal-oxide-semiconductor field-effect transistor (MOSFET). Moreover, since the sources 480, the drains 496, the semiconductor sheets 494 are doped with p-type dopant, since the semiconductor sheets 494 extend in the vertical direction, and since the gate stack 670 surrounds the semiconductor sheets 494, the configuration of the sources 480, the drains 496, the semiconductor sheets 494, and the gate stack 670 may be referred to as a VGAA p-channel MOSFET.

In some embodiments, the semiconductor device includes only a VGAA n-channel MOSFET. In other embodiments, the semiconductor device includes only a VGAA p-channel MOSFET.

It has thus been shown that the semiconductor device of the present disclosure includes a plurality of sources, a plurality of drains, and a semiconductor sheet unit. The semiconductor sheet unit includes a plurality of semiconductor sheets, each of which interconnects a respective one of the sources and a respective one of the drains. As is readily appreciated by those skilled in the art after reading this disclosure, since each of the semiconductor sheets, through which drain-to-source current/source-to-drain current flows, has a surface area that is relatively large, the semiconductor device of the present disclosure provides better heat dissipation and generates a higher drain-to-source/source-to-drain current, for a given set of operating conditions, without increasing the size of the semiconductor device.

In addition, since current is highly dependent on a channel through which it passes, and since the semiconductor sheet unit of the present disclosure, which serves as a channel between a source and a drain, can be configured in a variety of different cross-sectional shapes, the semiconductor device of the present disclosure can be configured with different source-to-drain current or drain-to-source current levels.

In one embodiment, a semiconductor device comprises a substrate that includes a well region, a pair of source/drain units that are disposed above the well region, and a semiconductor sheet unit that is disposed substantially vertically, that interconnects the source/drain units, and that defines a cross-sectional shape unit in a top view. The cross-sectional shape unit includes a plurality of cross-sections that have substantially the same shape and different sizes.

In another embodiment, a semiconductor device comprises a substrate that includes a well region, a pair of source/drain units that are disposed above the well region, and a semiconductor sheet unit that is disposed substantially vertically, that interconnects the source/drain units, and that defines a cross-sectional shape unit in a top view. The cross-sectional shape unit includes a plurality of cross-sections that have different shapes.

In yet another embodiment, a semiconductor device comprises a substrate that includes a well region, a pair of source/drain units that are disposed above the well region, and a semiconductor sheet unit that is disposed substantially vertically, that interconnects the source/drain units, and that defines in a top view a cross-sectional shape other than a straight line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate including a well region;
   a pair of source/drain units disposed above the well region; and
   a semiconductor sheet unit disposed substantially vertically, interconnecting the source/drain units, and defining a cross-sectional shape unit of the semiconductor sheet unit in a top view, wherein the cross-sectional shape unit of the semiconductor sheet unit in the top view includes a plurality of cross-sections that have substantially the same non-circular shape and different sizes.

2. The semiconductor device of claim 1, wherein each of the cross sections is a generally straight line cross section.

3. The semiconductor device of claim 1, wherein each of the cross sections includes a pair of straight lines that define an angle therebetween.

4. The semiconductor device of claim 1, wherein each of the cross sections is curved.

5. The semiconductor device of claim 1, wherein the substrate further includes a second well region that has a conductivity type different from a conductivity type of the well region, the semiconductor device further comprising:
   a pair of second source/drain units disposed above the second well region; and
   a second semiconductor sheet unit disposed substantially vertically and interconnecting the second source/drain units.

6. The semiconductor device of claim 5, wherein the second semiconductor sheet unit defines in the top view a cross-sectional shape unit different from the cross-sectional shape unit of the semiconductor sheet unit.

7. The semiconductor device of claim 1, further comprising a gate stack surrounding the semiconductor sheet unit.

8. A semiconductor device comprising:
   a substrate including a well region;
   a pair of source/drain units disposed above the well region; and
   a semiconductor sheet unit disposed substantially vertically, interconnecting the source/drain units, and defining a cross-sectional shape unit of the semiconductor sheet unit in a top view, wherein the cross-sectional shape unit of the semiconductor sheet unit in the top view includes a plurality of cross-sections that have different shapes.

9. The semiconductor device of claim 8, wherein one of the cross sections is a generally straight line cross section.

10. The semiconductor device of claim 8, wherein one of the cross sections includes a pair of straight lines that define an angle therebetween.

11. The semiconductor device of claim 8, wherein one of the cross sections is curved.

12. The semiconductor device of claim 8, wherein the substrate further includes a second well region that has a conductivity type different from a conductivity type of the well region, the semiconductor device further comprising:
   a pair of second source/drain units disposed above the second well region; and
   a second semiconductor sheet unit disposed substantially vertically and interconnecting the second source/drain units.

13. The semiconductor device of claim 12, wherein the second semiconductor sheet unit defines in the top view a cross-sectional shape unit different from the cross-sectional shape unit of the semiconductor sheet unit.

14. The semiconductor device of claim 8, further comprising a gate stack surrounding the semiconductor sheet unit.

15. A semiconductor device comprising:
   a substrate including a well region;

a pair of source/drain units disposed above the well region; and a semiconductor sheet unit disposed substantially vertically, interconnecting the source/drain units, and defining a cross-sectional shape of the semiconductor sheet unit in a top view that is neither a straight line nor a circular shape.

16. The semiconductor device of claim 15, wherein the cross-sectional shape of the semiconductor sheet unit in the top view includes a pair of straight lines that define an angle therebetween.

17. The semiconductor device of claim 15, wherein the cross-sectional shape of the semiconductor sheet unit in the top view is curved.

18. The semiconductor device of claim 15, wherein the substrate further includes a second well region that has a conductivity type different from a conductivity type of the well region, the semiconductor device further comprising:

a pair of second source/drain units disposed above the second well region; and a second semiconductor sheet unit disposed substantially vertically and interconnecting the second source/drain units.

19. The semiconductor device of claim 18, wherein the second semiconductor sheet unit defines in the top view a cross-sectional shape different from the cross-sectional shape of the semiconductor sheet unit.

20. The semiconductor device of claim 15, further comprising a gate stack surrounding the semiconductor sheet unit.

* * * * *